US012563788B2

(12) United States Patent
Jeong et al.

(10) Patent No.: US 12,563,788 B2
(45) Date of Patent: Feb. 24, 2026

(54) THIN FILM TRANSISTOR COMPRISING CRYSTALLINE IZTO OXIDE SEMICONDUCTOR, AND METHOD FOR PRODUCING SAME

(71) Applicant: IUCF-HYU (INDUSTRY-UNIVERSITY COOPERATION FOUNDATION HANYANG UNIVERSITY), Seoul (KR)

(72) Inventors: Jae Kyeong Jeong, Seoul (KR); Nu Ri On, Seoul (KR); Gwang Bok Kim, Incheon (KR)

(73) Assignee: IUCF-HYU (INDUSTRY-UNIVERSITY COOPERATION FOUNDATION UNIVERSITY), Seoul (KR)

( * ) Notice: Subject to any disclaimer, the term of this patent is extended or adjusted under 35 U.S.C. 154(b) by 844 days.

(21) Appl. No.: 17/798,414

(22) PCT Filed: Feb. 16, 2021

(86) PCT No.: PCT/KR2021/001949
§ 371 (c)(1),
(2) Date: Aug. 9, 2022

(87) PCT Pub. No.: WO2021/167315
PCT Pub. Date: Aug. 26, 2021

(65) Prior Publication Data
US 2023/0108600 A1     Apr. 6, 2023

(30) Foreign Application Priority Data

Feb. 18, 2020   (KR) ........................ 10-2020-0019637
Feb. 10, 2021   (KR) ........................ 10-2021-0018806

(51) Int. Cl.
H10D 30/67          (2025.01)
H10D 30/01          (2025.01)
(52) U.S. Cl.
CPC ....... *H10D 30/6756* (2025.01); *H10D 30/031* (2025.01); *H10D 30/6757* (2025.01)
(58) Field of Classification Search
CPC ........... H10D 30/6756; H10D 30/6757; H10D 30/031

(Continued)

(56) References Cited

U.S. PATENT DOCUMENTS

2013/0256653 A1 * 10/2013 Ahn ................... H10D 30/6757
                                                          257/E21.462
2015/0318359 A1 * 11/2015 Shimomura ........... H10D 86/60
                                                          257/43

(Continued)

FOREIGN PATENT DOCUMENTS

AU           614606 B2 *  9/1991  ........... H10N 60/855
CN       101099188 A     1/2008

(Continued)

OTHER PUBLICATIONS

Nuri On et al., "Achieving High Field-Effect Mobility Exceeding 60 cm2/Vs in IZTO Transistor Via Metal-Assisted Crystallization", Display Week 2019 Program, May 17, 2019, pp. 520-523, ISSN 0097-996X.

(Continued)

*Primary Examiner* — Eliseo Ramos Feliciano
*Assistant Examiner* — Timothy Edward Duren
(74) *Attorney, Agent, or Firm* — Sughrue Mion, PLLC

(57) ABSTRACT
A crystalline IZTO oxide semiconductor and a thin film transistor having the same are provided. The thin film transistor includes a gate electrode, a crystalline In—Zn—Sn oxide (IZTO) channel layer overlapping the upper or (Continued)

lower portions of the gate electrode and having hexagonal crystal grains, and a gate insulating layer disposed between the gate electrode and the IZTO channel layer, and source and drain electrodes respectively connected to both ends of the IZTO channel layer.

17 Claims, 5 Drawing Sheets

(58) Field of Classification Search
USPC ........................................................ 257/288
See application file for complete search history.

(56) References Cited

U.S. PATENT DOCUMENTS

| | | | | | |
|---|---|---|---|---|---|
| 2015/0354053 | A1 * | 12/2015 | Nishimura | .............. | C23C 14/08 |
| | | | | | 264/618 |
| 2016/0140918 | A1 * | 5/2016 | Koyama | .............. | H10D 86/423 |
| | | | | | 345/206 |
| 2019/0393353 | A1 * | 12/2019 | Jeong | ................ | H10D 30/6757 |
| 2020/0235247 | A1 * | 7/2020 | Oyama | ............. | H01L 21/02631 |

FOREIGN PATENT DOCUMENTS

| | | | |
|---|---|---|---|
| CN | 110634882 | A | 12/2019 |
| JP | 6001610 | B2 | 10/2016 |
| JP | 2019-064859 | A | 4/2019 |
| KR | 10-2011-0092277 | A | 8/2011 |
| KR | 10-2014-0137586 | A | 12/2014 |
| KR | 10-2015-0105527 | A | 9/2015 |
| KR | 10-2018-0020916 | A | 2/2018 |
| KR | 10-2020-0000664 | A | 1/2020 |

OTHER PUBLICATIONS

Jang Yeon Kwon et al., Recent progress in high performance and reliable n-type transition metal oxide-based thin film transistors, Semiconductor Science and Technology, Jan. 19, 2015, pp. 1-16, vol. 30, No. 2.
Wei Zhong et al., "Effects of annealing temperature on properties of InSnZnO thin film transistors prepared by Co-sputtering", The Royal Society of Chemistry RSC Advances, Oct. 10, 2018, pp. 34817-34822.
International Search Report for PCT/KR2021/001949, dated Jun. 2, 2021.

* cited by examiner

FIG.4

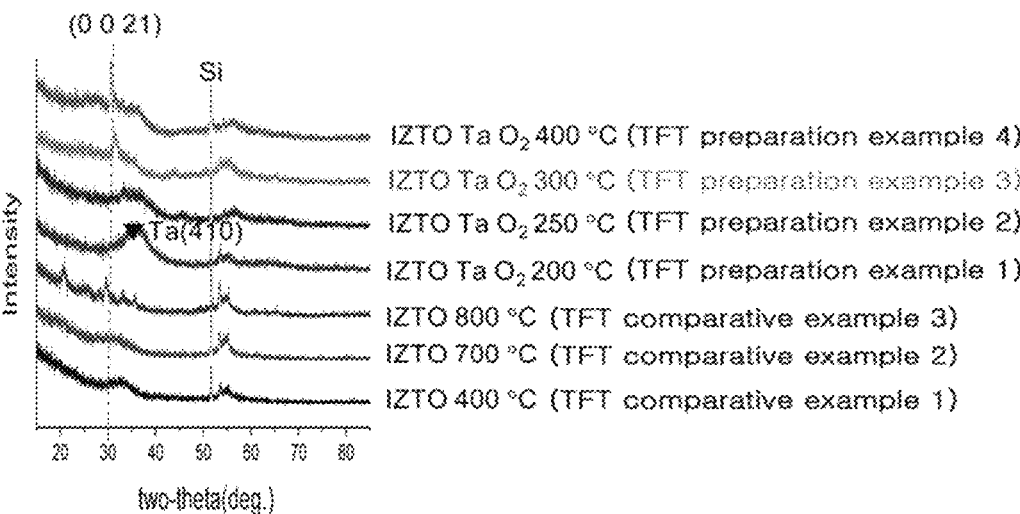

(0 0 21)

Si

IZTO Ta O₂ 400 °C (TFT preparation example 4)
IZTO Ta O₂ 300 °C (TFT preparation example 3)
IZTO Ta O₂ 250 °C (TFT preparation example 2)
IZTO Ta O₂ 200 °C (TFT preparation example 1)
IZTO 800 °C (TFT comparative example 3)
IZTO 700 °C (TFT comparative example 2)
IZTO 400 °C (TFT comparative example 1)

FIG.5

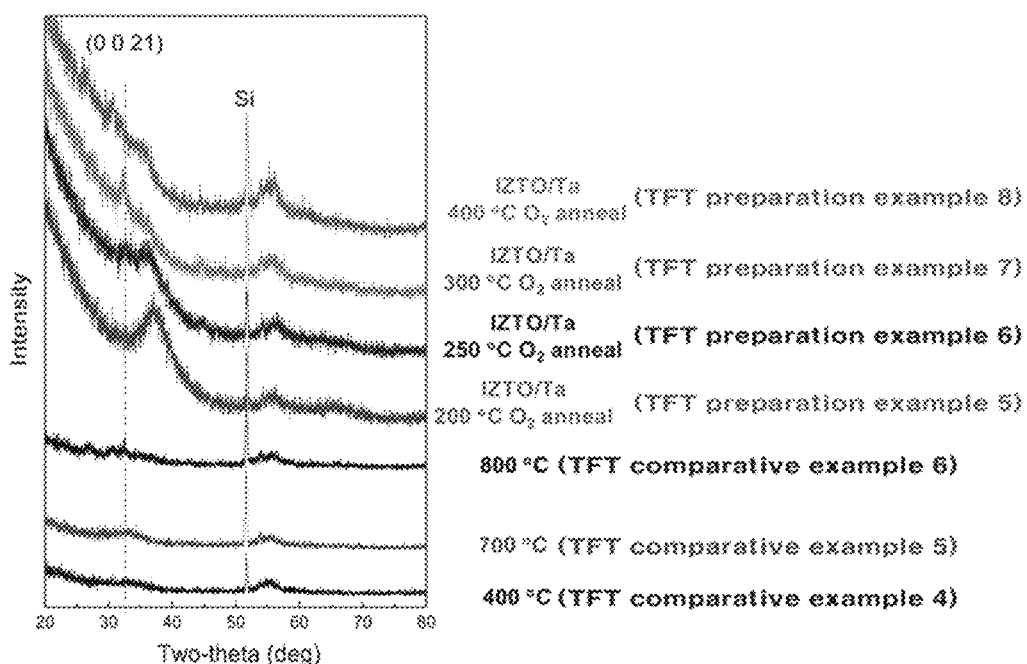

(0 0 21)

Si

IZTO/Ta
400 °C O₂ anneal (TFT preparation example 8)
IZTO/Ta
300 °C O₂ anneal (TFT preparation example 7)
IZTO/Ta
250 °C O₂ anneal (TFT preparation example 6)
IZTO/Ta
200 °C O₂ anneal (TFT preparation example 5)
800 °C (TFT comparative example 6)
700 °C (TFT comparative example 5)
400 °C (TFT comparative example 4)

Ta / IZTO (In$_{0.23}$Zn$_{0.55}$Sn$_{0.21}$O)

(TFT preparation example 1)

Ta / IZTO (In$_{0.23}$Zn$_{0.55}$Sn$_{0.21}$O)

(TFT preparation example 2)

Ta / IZTO (In$_{0.23}$Zn$_{0.55}$Sn$_{0.21}$O)

(TFT preparation example 3)

Ta / IZTO (In$_{0.23}$Zn$_{0.55}$Sn$_{0.21}$O)

(TFT preparation example 4)

FIG.7A
Ta / IZTO ($In_{0.18}Zn_{0.60}Sn_{0.21}O$)
(TFT preparation example 5)
$O_2$ 200°C
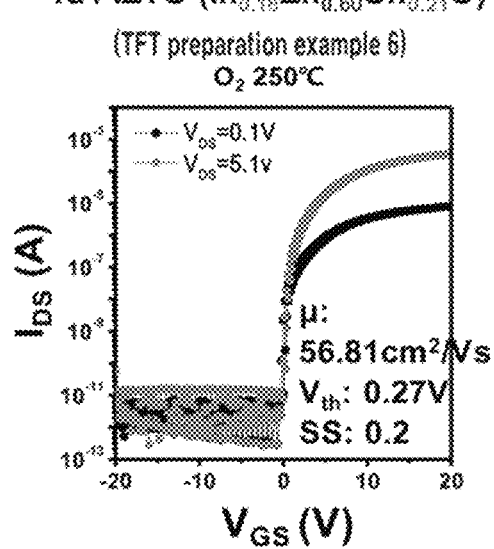
μ: 66.48cm²/Vs
$V_{th}$: 0.04V
SS: 0.27
FIG.7B
Ta / IZTO ($In_{0.18}Zn_{0.60}Sn_{0.21}O$)
(TFT preparation example 6)
$O_2$ 250°C
μ: 56.81cm²/Vs
$V_{th}$: 0.27V
SS: 0.2
FIG.7C
Ta / IZTO ($In_{0.18}Zn_{0.60}Sn_{0.21}O$)
(TFT preparation example 7)
$O_2$ 300°C
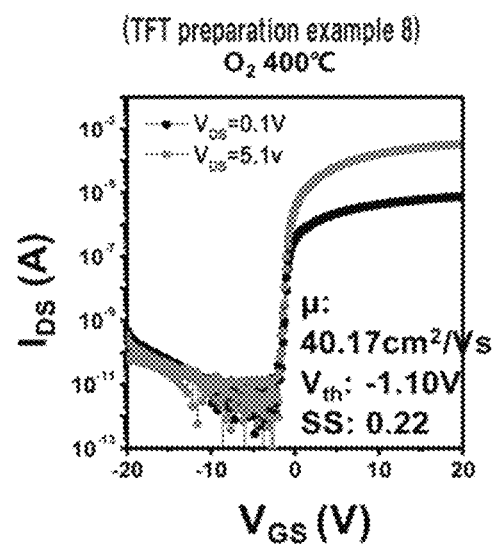
μ: 46.92cm²/Vs
$V_{th}$: 0.20V
SS: 0.23
FIG.7D
Ta / IZTO ($In_{0.18}Zn_{0.60}Sn_{0.21}O$)
(TFT preparation example 8)
$O_2$ 400°C
μ: 40.17cm²/Vs
$V_{th}$: -1.10V
SS: 0.22

THIN FILM TRANSISTOR COMPRISING CRYSTALLINE IZTO OXIDE SEMICONDUCTOR, AND METHOD FOR PRODUCING SAME

CROSS REFERENCE TO RELATED APPLICATIONS

This application is a National Stage of International Application No. PCT/KR2021/001949 Filed Feb. 16, 2021, Claiming Priority Based on Korean Patent Application No. 10-2020-0019637 filed Feb. 18, 2020 and Korean Patent Application No. 10-2021-0018806 filed Feb. 10, 2021.

TECHNICAL FIELD

The present invention relates to a semiconductor device, and more particularly, to a transistor having an oxide semiconductor layer.

BACKGROUND ART

As a silicon film used as a semiconductor film of a transistor, an amorphous silicon film or a polycrystalline silicon film is used depending on applications. For example, in the case of a transistor included in a large-sized display device, it is preferable to use an amorphous silicon film that can have relatively uniform characteristics even though it is formed in a large area. On the other hand, in the case of a device including a driving circuit or the like, it is preferable to use a polycrystalline silicon film capable of exhibiting high field-effect mobility. As a method for forming the polycrystalline silicon film, methods are known in which an amorphous silicon film is subjected to high-temperature heat treatment or laser light treatment.

Recently, research is being conducted using an oxide semiconductor as a channel layer of a transistor (JP Publication 2006-165528). However, most of the oxide semiconductor layer is an amorphous layer, and is known to be electrically and chemically unstable.

DISCLOSURE

Technical Problem

The problem to be solved by the present invention is to provide a thin film transistor having a polycrystalline oxide semiconductor thin film exhibiting high field-effect mobility.

The technical problems of the present invention are not limited to the technical problems mentioned above, and other technical problems not mentioned will be clearly understood by those skilled in the art from the following description.

Technical Solution

One aspect of the present invention provides a thin film transistor. The thin film transistor comprises a gate electrode, a crystalline In—Zn—Sn oxide (IZTO) channel layer overlapping the upper or lower portions of the gate electrode and having hexagonal crystal grains, a gate insulating layer disposed between the gate electrode and the IZTO channel layer, and source and drain electrodes respectively connected to both ends of the IZTO channel layer.

The hexagonal crystal grains may be crystal grains having a $(ZnO)_k In_2 O_3$ (k is an integer of 3 to 11) phase. The k may be 5 in the $(ZnO)_k In_2 O_3$ phase.

The IZTO channel layer may further have $(x)ZnIn_2 O_4$-$(1-x)Zn_2 SnO_4$ ($0 < x < 0.45$), as a sub-solid phase. $SnO_2$ may be mixed in the $(ZnO)_k In_2 O_3$ (k is an integer of 3 to 11) phase to exist in the form of a solid solution.

The hexagonal crystal grains may have a JCPDS card number of 20-1440. The XRD graph for the IZTO channel layer may show a diffraction peak corresponding to (0021) plane. A full width at half maximum (FWHM) of the diffraction peak may be about 0.3 to 0.5 radians.

The IZTO channel layer may have 21 to 25 at % of indium (In), 54 to 57 at % of zinc (Zn), and 19 to 22 at % of tin (Sn) when the sum of the number of atoms of indium, zinc, and tin is 100%. Specifically, the IZTO channel layer may have 22.5 to 23.5 at % of In, 54.7 to 55.5 at % of Zn, and 20.5 to 21.3 at % of Sn when the sum of the number of atoms of indium, zinc, and tin is 100%.

Another aspect of the present invention provides a preparation method for a crystalline IZTO. First, an amorphous In—Zn—Sn oxide (IZTO) layer is formed on a substrate. A transition metal layer containing a transition metal having a large oxidation tendency compared to In, Zn, and Sn is formed under the amorphous IZTO layer before forming the amorphous IZTO layer or on the amorphous IZTO layer after forming the amorphous IZTO layer. The amorphous IZTO layer is changed into a crystalline IZTO layer having hexagonal crystal grains by performing a crystallization heat treatment on the substrate on which the amorphous IZTO layer and the transition metal layer are formed.

The amorphous IZTO layer may have 21 to 25 at % of indium (In), 54 to 57 at % of zinc (Zn), and 19 to 22 at % of tin (Sn) when the sum of the number of atoms of indium, zinc, and tin is 100%. Specifically, the amorphous IZTO layer may have 22.5 to 23.5 at % of In, 54.7 to 55.5 at % of Zn, and 20.5 to 21.3 at % of Sn when the sum of the number of atoms of indium, zinc, and tin is 100%.

The heat treatment temperature may be 270° C. to 350° C. The transition metal layer may be a Ta layer. The hexagonal crystal grains may be crystal grains having a $(ZnO)_k In_2 O_3$ (k is 5) phase.

Another aspect of the present invention provides a preparation method for a thin film transistor. The thin film transistor may include a gate electrode on a substrate; a channel layer overlapping the upper or lower portions of the gate electrode; a gate insulating layer disposed between the gate electrode and the channel layer; and source and drain electrodes respectively connected to both ends of the channel layer. Here, the channel layer is a crystalline IZTO layer, the crystalline IZTO layer may be obtained by forming an amorphous In—Zn—Sn oxide (IZTO) layer, forming a transition metal layer containing a transition metal having a large oxidation tendency compared to In, Zn, and Sn under the amorphous IZTO layer before forming the amorphous IZTO layer or on the amorphous IZTO layer after forming the amorphous IZTO layer, and changing the amorphous IZTO layer into the crystalline IZTO layer having hexagonal crystal grains by performing a crystallization heat treatment on the substrate on which the amorphous IZTO layer and the transition metal layer are formed.

Advantageous Effects

According to embodiments of the present invention, it is possible to provide a thin film transistor having a crystalline oxide semiconductor thin film exhibiting high field-effect mobility.

However, the effects of the present invention are not limited to the above-mentioned effects, and other effects not mentioned will be clearly understood by those skilled in the art from the following description.

DESCRIPTION OF DRAWINGS

FIG. 4 is a graph showing XRD patterns of IZTO semiconductor patterns included in TFTs prepared in TFT Preparation Examples 1 to 4 and TFT Comparative Examples 1 to 3.

FIG. 5 is a graph showing XRD patterns of IZTO semiconductor patterns included in TFTs manufactured in TFT Preparation Examples 5 to 8 and TFT Comparative Examples 4 to 6.

FIGS. 7A, 7B, 7C, and 7D are graphs showing the transmission characteristics of the TFTs according to TFT Preparation Examples 5 to 8, respectively.

MODES OF THE INVENTION

Figure 1:
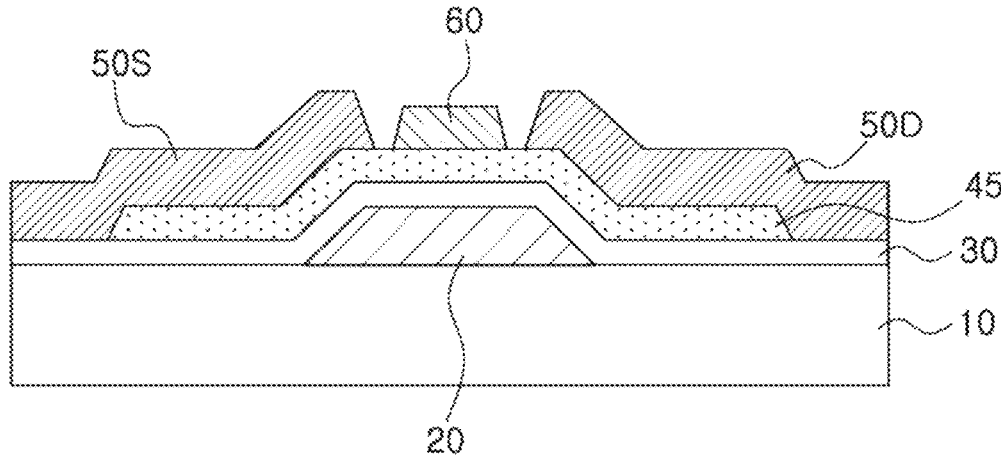
FIG. 1 is a cross-sectional view showing a thin film transistor according to an embodiment of the present invention.

Hereinafter, preferred embodiments of the present invention will be described in more detail with reference to the accompanying drawings in order to describe the present invention in more detail. However, the present invention is not limited to the embodiments described herein and may be embodied in other forms. In the drawings, when a layer is said to be "on" another layer or substrate, it may be formed directly on another layer or substrate, or a third layer may be interposed between them.

Thin Film Transistor

FIG. 1 is a cross-sectional view showing a thin film transistor according to an embodiment of the present invention.

Referring to FIG. 1, a substrate 10 may be provided. The substrate 10 may be a semiconductor, metal, glass or polymer substrate. In one example, the substrate 10 may be a semiconductor or a metal substrate. An insulating barrier layer (not shown) may be formed on the substrate 10. In one example, the substrate 10 may be a silicon substrate, and the insulating barrier layer may be a silicon oxide layer.

A gate electrode 20 extending in one direction may be formed on the substrate 10. The gate electrode 20 may be formed of Al, Cr, Cu, Ta, Ti, Mo, W, or alloys thereof. A gate insulating layer 30 may be formed on the gate electrode 20. The gate insulating layer 30 may be a silicon oxide film, for example, a $SiO_2$ film; a silicon oxynitride film (SiON); an aluminum oxynitride film; a high-k insulating film having a higher dielectric constant compared to a silicon oxide film; or a composite film thereof. As an example of the high-k insulating film having a higher dielectric constant compared to a silicon oxide film may be $Al_2O_3$, $HfO_2$, or $ZrO_2$.

An indium-zinc-tin oxide layer (In—Zn—Sn oxide, hereinafter referred to as IZTO) disposed to overlap the gate electrode 20 on the gate insulating layer 30 may be formed as a channel layer 45.

The IZTO channel layer 45 may be a metal oxide layer containing indium, zinc, and tin, and may be an electron conductive layer, that is, an N-type semiconductor layer. This IZTO channel layer 45 may be in an amorphous state in the deposited state (as deposited). The IZTO channel layer 45 may be formed using a variety of methods used in the art, and specifically, a physical vapor deposition method such as sputtering or a chemical deposition method such as chemical vapor deposition, atomic layer deposition. In one embodiment, the IZTO channel layer 45 may be formed using a sputtering method using an IZTO target in an inert gas atmosphere. In addition, the IZTO channel layer 45 may be patterned using various methods used in the art. The IZTO channel layer 45 may be formed to have a thickness of several to several tens of nm, for example, 10 to 50 nm, for example, 10 to 30 nm, which can be sufficiently crystallized in a heat treatment to be described later.

The IZTO channel layer 45 may contain 21 to 25 at % of indium (In), 54 to 57 at % of zinc (Zn), and 19 to 22 at % of tin (Sn) when the sum of the number of atoms of indium, zinc, and tin is 100%. In other words, the IZTO channel layer 45 may contain 21 to 25 mol % of indium oxide ($InO_{1.5}$), 54 to 57 mol % of zinc oxide (ZnO), and 19 to 22 mol % of tin oxide ($SnO_2$). Specifically, the IZTO channel layer 45 may include 22 to 24 at % of In, 54.5 to 56 at % of Zn, and 20 to 21.5 at % of Sn, more specifically 22.5 to 23.5 at % of In, 54.7 to 55.5 at % of Zn, and 20.5 to 21.3 at % of Sn when the sum of the number of atoms of In, Zn, and Sn is 100%. In other words, the IZTO channel layer 45 may contain 22 to 24 mol % of $InO_{1.5}$, 54.5 to 56 mol % of ZnO, and 20 to 21.5 mol % of $SnO_2$, more specifically 22.5 to 23.5 mol % of $InO_{1.5}$, 54.7 to 55.5 mol % of ZnO and 20.5 to 21.3 mol % of $SnO_2$.

A source electrode 50S and a drain electrode 50D may be formed on both ends of the IZTO channel layer 45, and a portion of the surface of IZTO channel layer 45 may be exposed between the source electrode 50S and the drain electrode 50D. The source electrode 50S and the drain electrode 50D may may be formed using at least one metal of aluminum (Al), neodymium (Nd), silver (Ag), chromium (Cr), titanium (Ti), tantalum (Ta), and molybdenum (Mo), or an alloy containing at least one of them, or a metal oxide conductive film such as Indium Tin Oxide (ITO).

The substrate on which the source/drain electrodes 50S and 50D are formed may be subjected to post-deposition annealing. The post-deposition annealing may be performed at a temperature of about 300 to 500° C., for example, about 250 to 450° C., more specifically, about 270 to 430° C. in an oxygen atmosphere, specifically, an atmospheric atmosphere. In this case, an ohmic junction may be formed between the source/drain electrodes 50S and 50D and the IZTO channel layer 45.

A patterned transition metal layer 60 may be formed on a portion of the IZTO channel layer 45 exposed between the source electrode 50S and the drain electrode 50D. The transition metal layer 60 may be a layer containing a transition metal, and the transition metal contained therein may be a transition metal having a greater oxidation tendency than the metal(s) contained in the IZTO channel layer 45, that is, In, Zn, and Sn. As an example, the transition metal layer may be a Ta layer, a Ti layer, or a Mo layer. As another example, the transition metal layer may be a transition metal nitride film containing a small amount of nitrogen, for example, a transition metal nitride film having a nitrogen content of 5 to 35 atomic percent, that is, a transition metal-rich transition metal nitride film such as Ti-rich TiN layer, a Ta-rich TaN layer, or a Mo-rich MoN layer.

Specifically, when the transition metal contained in the transition metal layer 60 is Ta, Gibbs free energy (ΔGf) for forming $Ta_2O_5$ as an example of Ta oxide may be lower than the Gibbs free energy for forming oxides of each of the metals contained in the IZTO channel layer 45. For example, Gibbs free energy (ΔGf) for forming $Ta_2O_5$ as an example of Ta oxide may be lower than the Gibbs free energy for forming $SnO_2$ as an example of Sn oxide, the Gibbs free energy for forming ZnO as an example of Zn oxide, or the Gibbs free energy for forming $In_2O_3$ as an example of In oxide. In other words, Ta may have a greater oxidation tendency than In, Zn, and Sn.

The transition metal layer 60 may have a thickness of 3 to 30 nm, for example, the transition metal layer 60 may be formed to have a thickness of 5 to 20 nm, specifically, 7 to 15 nm. The ratio of the thickness of the IZTO channel layer 45 to the thickness of the transition metal layer 60 is 3:1 to 1:2, for example, 2:1 to 1:1 for uniform crystallization of the IZTO channel layer to be performed later.

In addition, the transition metal layer 60 may be formed to overlap the gate electrode 20 located under the IZTO channel layer 45, specifically, may be formed to overlap the central portion of the gate electrode 20 or the center portion of the TFT channel region. However, in this embodiment, the transition metal layer 60 may have a shorter length compared to a channel length of the TFT, that is, the distance between the source/drain electrodes 50S and 50D, so that the transition metal layer 60 cannot contact the source/drain electrodes 50S and 50D, also may have a width equal to or wider than the channel width of the TFT so that crystallization, which will be described later, occurs over the entire channel width of the IZTO channel layer 45.

After the transition metal layer 60 is formed, the resultant may be subjected to crystallization heat treatment. The crystallization heat treatment may be performed in an oxygen atmosphere, specifically, in an atmospheric atmosphere, and in a temperature range of about 150° C. to 500° C., specifically more than about 250° C. and less than 400° C., more specifically about 270° C. to 350° C. or about 290° C. to 310° C.

In the crystallization heat treatment process, in the IZTO channel layer 45 near the interface between the transition metal layer 60 and the IZTO channel layer 45, oxygen species loosely bound to metal atoms for example, interstitial oxygen and a hydroxyl group may be removed or consumed by reacting with the metal in the transition metal layer 60 to form a transition metal oxide ($M^aO_x$, $M^a$ is a metal in the transition metal layer), and, while the transition metal oxide is formed in the transition metal layer 60, electrons can be emitted into the IZTO channel layer 45. The electrons supplied into the IZTO channel layer 45 at the interface in contact with the transition metal layer 60 may be transferred to an antibonding orbital of a metal-oxygen bond in the IZTO channel layer 45, thereby weakening the metal-oxygen bond at the interface. In addition, the metal-oxygen bond of the interface weakened during the crystallization heat treatment process may be broken and rearranged from the interface, and as this rearrangement is propagated to the inside of the IZTO channel layer 45, the entire IZTO channel layer 45 may be converted to crystalline, specifically polycrystalline, at relatively low temperature. As a result, the metal-oxygen lattice fraction in the IZTO channel layer 45 may increase compared to the fraction before the heat treatment, and also a degree of crystallinity may increase.

Meanwhile, the degree of crystallinity in the IZTO channel layer 45 may decrease from the side in contact with the transition metal layer 60 toward the opposite side thereof, that is, toward the gate insulating layer 30. In other words, the degree of crystallinity in the IZTO channel layer 45 may decrease toward the gate insulating layer 30 from the surface opposite to the surface in contact with the gate insulating film 30.

The crystallized IZTO channel layer 45 may be a polycrystalline layer having a plurality of crystal grains, and the crystal grains may be in a percolated form, that is, the crystal grains may contact each other to form a grain boundary.

In addition, the crystallized IZTO channel layer 45 may have a $(ZnO)_kIn_2O_3$ (k=integer) phase, which is a homologous compound phase, as a main crystal structure. The homogeneous compound phase may have a structure in which $InO_2$ and $(InZn_k)O_{k+1}$ structures are alternately repeatedly stacked, and may exhibit a hexagonal structure. This crystal structure may have a JCPDS card number of 20-1440. In the $(ZnO)_kIn_2O_3$ (k=integer) phase, k may be 5. Accordingly, the XRD graph for the IZTO channel layer 45 may show a diffraction peak corresponding to the (0021) plane when 2θ is about 32 degrees. In addition, the full width at half maximum (FWHM) of the diffraction peak may be about 0.3 to 0.5 radians, specifically, about 0.32 to 0.45 radians, and more specifically, about 0.35 to 0.4 radians.

$SnO_2$ may be mixed in the $(ZnO)_kIn_2O_3$ (k=integer) phase to exist in the form of a solid solution. In addition, the IZTO channel layer 45 may have a spinel phase, that is, $(x)ZnIn_2O_4$-$(1-x)Zn_2SnO_4$ (0<x<0.45), as a sub-solid phase, which is a secondary crystal phase, in addition to the $(ZnO)_kIn_2O_3$ (k=integer) phase, which is the main crystal phase.

On the other hand, when the crystallization heat treatment is carried out in an oxygen atmosphere, the transition metal layer 60 may be oxidized not only on the interface in contact with the IZTO channel layer 45 but also on the surface exposed to the oxygen atmosphere, so that the transition metal layer 60 may be changed into a transition metal oxide layer, which is an insulator, for example Ta oxide layer, Ti oxide layer, or Mo oxide layer. However, when the crystallization heat treatment is performed in a nitrogen atmosphere, the transition metal layer 60 may be oxidized near the interface in contact with the metal oxide channel layer 45 and may be nitridated near the surface exposed to the nitrogen atmosphere, so that the transition metal layer 60 may be oxynitridated as a whole and changed into a transition metal oxynitride layer (ex. Ta oxynitride layer, Ti oxynitride layer, or Mo oxynitride layer) which is an insulator. After the crystallization heat treatment, the transition metal oxide layer or the transition metal oxynitride layer may be removed by etching to expose the surface of the metal oxide channel layer 45. However, the present invention is not limited thereto.

Figure 2:
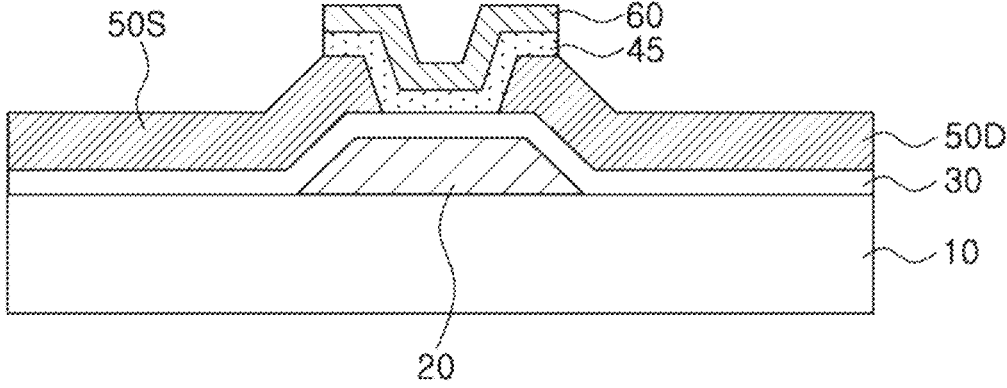
FIG. 2 is a cross-sectional view showing a method of manufacturing a thin film transistor according to another embodiment of the present invention.

FIG. 2 is a cross-sectional view showing a method of manufacturing a thin film transistor according to another embodiment of the present invention. The thin film transistor manufacturing method according to the present embodiment may be similar to the thin film transistor manufacturing method described with reference to FIG. 1, except as described later.

Referring to FIG. 2, a gate electrode 20 extending in one direction may be formed on a substrate 10, and a gate insulating layer 30 may be formed on the gate electrode 20. A source electrode 50S and a drain electrode 50D may be formed on the gate insulating layer 30. At least a portion of a portion of the gate insulating layer 30 overlapping the gate electrode 20 may be exposed between the source electrode 50S and the drain electrode 50D.

An IZTO channel layer covering the exposed gate insulating layer 30 and the source electrode 50S and the drain electrode 50D may be formed as described with reference to FIG. 1. Specifically, the IZTO channel layer may be formed to have a thickness of several to several tens of nm, for example, 10 to 50 nm, for example, 10 to 30 nm, which can be sufficiently crystallized in a heat treatment to be described later. In addition, when the sum of the number of atoms of indium, zinc, and tin is 100%, the IZTO channel layer may have 21 to 25 at % of indium (In), 54 to 57 at % of zinc (Zn), and 19 to 22 at % of tin (Sn). Specifically, when the sum of the number of atoms of In, Zn, and Sn is 100%, the IZTO channel layer may have 22 to 24 at % of In, 54.5 to 56 at % of Zn, and 20 to 21.5 at % of Sn, more specifically, 22.5 to 23.5 at % of In, 54.7 to 55.5 at % of Zn, and 20.5 to 21.3 at % of Sn.

The substrate on which the metal oxide channel layer is formed may be subjected to post-deposition annealing as described with reference to FIG. 1.

Thereafter, a transition metal layer may be formed on the IZTO channel layer. Specifically, the transition metal layer may be a Ta layer, a Ti layer, or a Mo layer. As another example, the transition metal layer is a transition metal nitride layer containing a small amount of nitrogen, for example, 5 to 35 at % of nitrogen. In other words, the transition metal nitride layer may be a transition metal-rich transition metal nitride layer, for example, Ti-rich TiN layer, a Ta-rich TaN layer, or a Mo-rich MoN layer.

Thereafter, the transition metal layer and the IZTO channel layer may be sequentially patterned to form the patterned IZTO channel layer 45 and the transition metal layer 60 sequentially stacked on the gate insulating layer 30. As a result, the patterned IZTO channel layer 45 and the transition metal layer 60 may have substantially the same width and length. The IZTO channel layer 45 may cross the upper portion of the gate electrode 20 and may be respectively connected to the source electrode 50S and the drain electrode 50D at both ends. In other words, the source electrode 50S and the drain electrode 50D may be connected to the metal oxide pattern 45 under both ends of the IZTO channel layer 45.

In a state in which the transition metal layer 60 is deposited and not patterned or in a state in which the transition metal layer 60 is deposited and patterned, the resultant may be subjected to crystallization heat treatment as described with reference to FIG. 1. Specifically, the crystallization heat treatment may be performed in an oxygen atmosphere, specifically, in an atmospheric atmosphere, and in a temperature range of about 150° C. to 500° C., specifically more than about 250° C. and less than about 400° C., more specifically about 270° C. to 350° C. or about 290° C. to 310° C.

In the crystallization heat treatment process, the IZTO channel layer 45 may be crystallized as described with reference to FIG. 1. Specifically, the crystallized IZTO channel layer 45 may have a $(ZnO)_k In_2 O_3$ (k=integer) phase, which is a homologous compound phase, as a main crystal structure. The homogeneous compound phase may have a structure in which $InO_2$ and $(InZn_k)O_{k+1}$ structures are alternately repeatedly stacked, and may exhibit a hexagonal structure. This crystal structure may have a JCPDS card number of 20-1440. In the $(ZnO)_k In_2 O_3$ (k=integer) phase, k may be 5. Accordingly, the XRD graph for the IZTO channel layer 45 may show a diffraction peak corresponding to the (0021) plane when 20 is about 32 degrees. In addition, the full width at half maximum (FWHM) of the diffraction peak may be about 0.3 to 0.5 radians, specifically, about 0.32 to 0.45 radians, and more specifically, about 0.35 to 0.4 radians.

$SnO_2$ may be mixed in the $(ZnO)_k In_2 O_3$ (k=integer) phase to exist in the form of a solid solution. In addition, the IZTO channel layer 45 may have a spinnel phase, that is, $(x)ZnIn_2O_4$-$(1-x)Zn_2SnO_4$ (0<x<0.45), as a sub-solid phase, which is a secondary crystal phase, in addition to the $(ZnO)_k In_2 O_3$ (k=integer) phase, which is the main crystal phase.

Figure 3A:
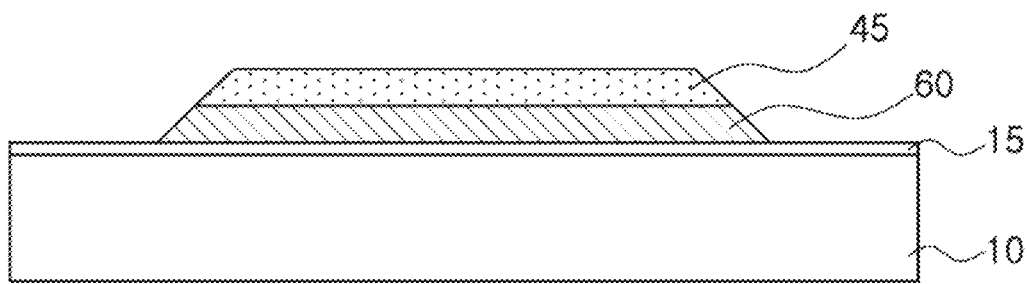
FIGS. 3A and 3B are cross-sectional views illustrating a method of manufacturing a thin film transistor according to another embodiment of the present invention.
Figure 3B:
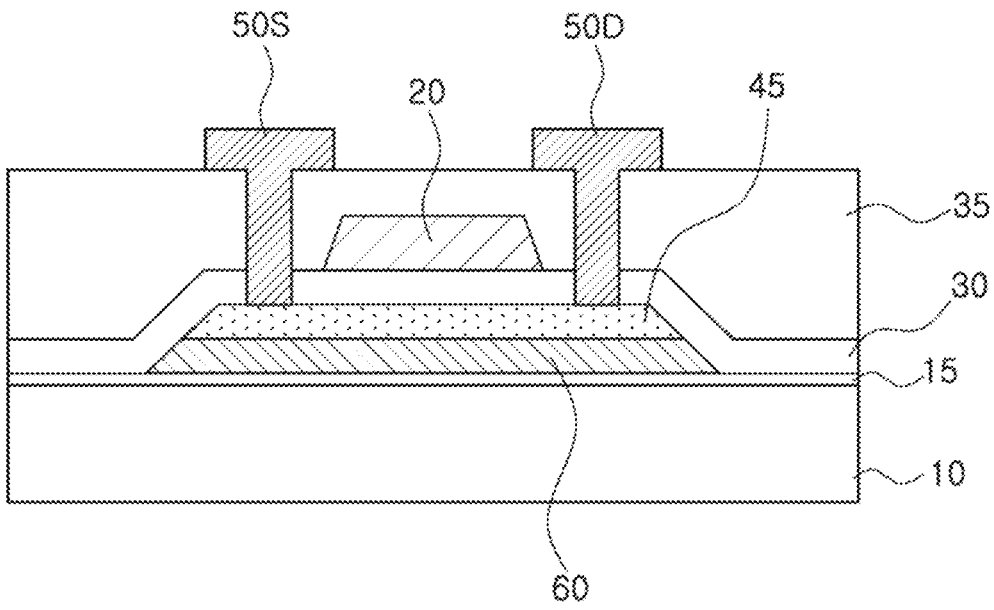
Figure 6A:
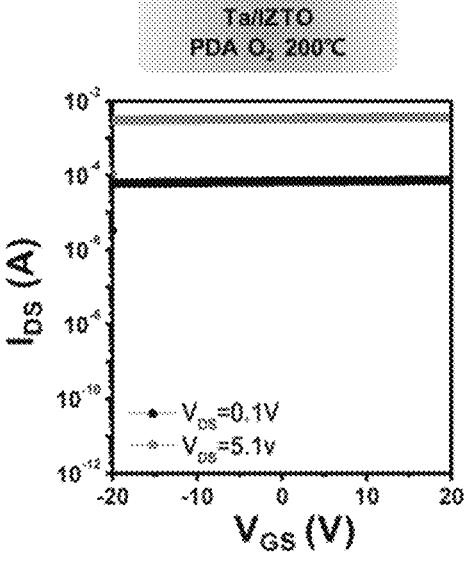
FIGS. 6A, 6B, 6C, and 6D are graphs showing the transmission characteristics of TFTs according to TFT Preparation Examples 1 to 4, respectively.
Figure 6B:
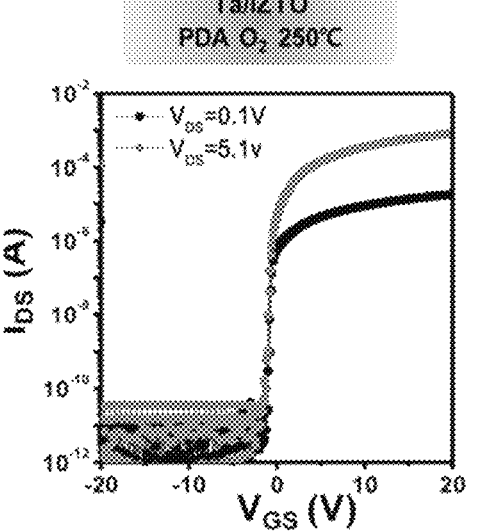
Figure 6C:
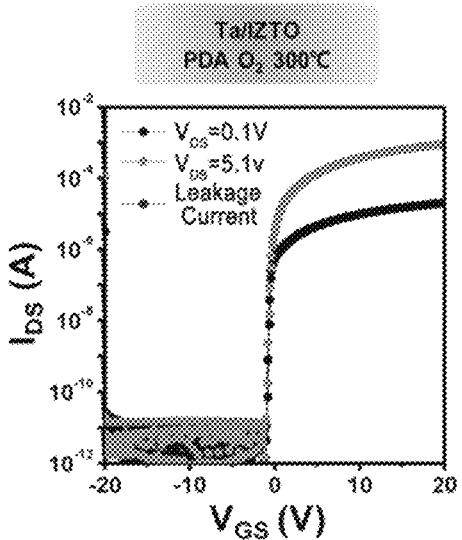
Figure 6D:
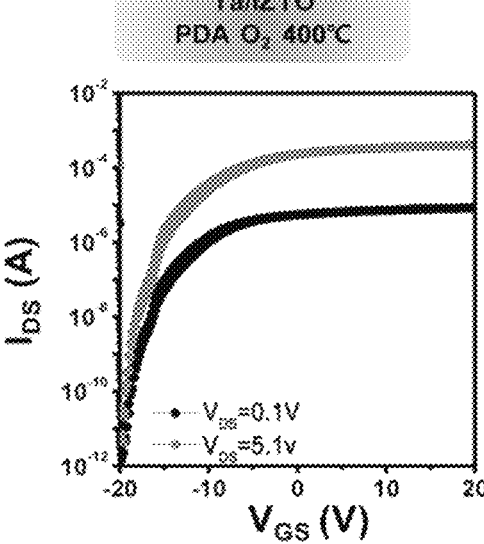

FIGS. 3A and 3B are cross-sectional views illustrating a method of manufacturing a thin film transistor according to another embodiment of the present invention. The thin film transistor manufacturing method according to the present embodiment may be similar to the thin film transistor manufacturing method described with reference to FIG. 1, except as described later.

Referring to FIG. 3A, a buffer layer 15 may be formed on the substrate 10. The buffer layer 15 may be a silicon oxide layer, a silicon oxynitride layer, a silicon nitride layer, or a composite layer thereof.

A transition metal layer and an IZTO channel layer are sequentially formed on the buffer layer 15, and the IZTO channel layer and the transition metal layer are sequentially patterned to form the patterned transition metal layer 60 and IZTO channel layer 45 sequentially stacked on the buffer layer 15. As a result, the patterned IZTO channel layer 45 and the transition metal layer 60 may have substantially the same width and length. Specifically, the IZTO channel layer 45 may be formed to have a thickness of several to several tens of nm, for example, 10 to 50 nm, for example, 10 to 30 nm, which can be sufficiently crystallized in a heat treatment to be described later. In addition, when the sum of the number of atoms of indium, zinc, and tin is 100%, the IZTO channel layer 45 may have 21 to 25 at % of indium (In), 54 to 57 at % of zinc (Zn), and 19 to 22 at % of tin (Sn). Specifically, when the sum of the number of atoms of In, Zn, and Sn is 100%, the IZTO channel layer may have 22 to 24 at % of In, 54.5 to 56 at % of Zn, and 20 to 21.5 at % of Sn, more specifically, 22.5 to 23.5 at % of In, 54.7 to 55.5 at % of Zn, and 20.5 to 21.3 at % of Sn. The transition metal layer 60 may be a Ta layer, a Ti layer, or a Mo layer. As another example, the transition metal layer 60 is a transition metal nitride layer containing a small amount of nitrogen, for example, 5 to 35 at % of nitrogen. In other words, the transition metal nitride layer may be a transition metal-rich transition metal nitride layer, for example, Ti-rich TiN layer, a Ta-rich TaN layer, or a Mo-rich MoN layer.

In a state in which the transition metal layer is deposited and not patterned or in a state in which the transition metal layer is deposited and patterned, the resultant may be subjected to crystallization heat treatment as described with reference to FIG. 1. Specifically, the crystallization heat treatment may be performed in a temperature range of about 150° C. to 500° C., specifically more than about 250° C. and less than about 400° C., more specifically about 270° C. to 350° C. or about 290° C. to 310° C. However, the crystallization heat treatment described with reference to FIG. 1 may be performed in an oxygen or nitrogen atmosphere, but in this embodiment, the crystallization heat treatment may be performed in an oxygen atmosphere instead of a nitrogen atmosphere.

In the crystallization heat treatment process, the IZTO channel layer 45 may be crystallized as described with reference to FIG. 1. Specifically, the crystallized IZTO channel layer 45 may have hexagonal crystal grains, for example, and mainly have crystal grains having a (ZnO)$_k$In$_2$O$_3$ (an integer of k=3 to 11) phase, which is a homologous compound phase. In other words, the crystallized IZTO channel layer 45 may have a (ZnO)$_k$In$_2$O$_3$ (k=an integer of 3 to 11) phase as a main crystal structure.

The homogeneous compound phase may have a structure in which InO$_2$ and (InZn$_k$)O$_{k+1}$ structures are alternately repeatedly stacked, and the JCPDS card number of this crystal structure may be 20-1440. In the (ZnO)$_k$In$_2$O$_3$ (k=integer) phase, k may be 5. Accordingly, the XRD graph for the IZTO channel layer 45 may show a diffraction peak corresponding to the (0021) plane when 2θ is about 30 to 33 degrees, specifically 32 degrees. In addition, the full width at half maximum (FWHM) of the diffraction peak may be about 0.3 to 0.5 radians, specifically, about 0.32 to 0.45 radians, and more specifically, about 0.35 to 0.4 radians.

SnO$_2$ may be mixed in the (ZnO)$_k$In$_2$O$_3$ (k=integer) phase to exist in the form of a solid solution. In addition, the IZTO channel layer 45 may have a spinel phase, that is, (x)ZnIn$_2$O$_4$-(1-x)Zn$_2$SnO$_4$ (0<x<0.45), as a sub-solid phase, which is a secondary crystal phase, in addition to the (ZnO)$_k$In$_2$O$_3$ (k=integer) phase, which is the main crystal phase.

Referring to FIG. 3B, a gate insulating layer 30 may be formed on the IZTO channel layer 45. A gate electrode 20 crossing the upper portion of the IZTO channel layer 45 may be formed on the gate insulating layer 30. As a result, the IZTO channel layer 45 may be disposed to overlap the gate electrode 20 under the gate electrode 20. Thereafter, an interlayer insulating layer 35 covering the gate electrode 20 may be formed on the gate electrode 20. The interlayer insulating layer 35 may be a silicon oxide layer, a silicon oxynitride layer, a silicon nitride layer, or a composite layer thereof.

Contact holes exposing both ends of the IZTO channel layer 45 are respectively formed in the interlayer insulating layer 35 and the gate insulating layer 30 thereunder, and a source electrode 50S and a drain electrode 50D respectively connected to both ends of the IZTO channel layer 45 may be formed in the contact holes. Thereafter, heat treatment for improving ohmic bonding between the IZTO channel layer 45 and the source/drain electrodes 50S and 50D, that is, post-deposition annealing, may be performed. The post-deposition annealing may be performed at a temperature of about 300 to 500° C., for example, about 250 to 450° C., more specifically, about 270 to 430° C. in an oxygen atmosphere, specifically, in an atmospheric atmosphere.

The thin film transistors shown in FIGS. 1, 2, and 3B respectively show a bottom gate/top contact structure, a bottom gate/bottom contact structure, and a top gate/top contact structure. However, the present invention is not limited thereto, and a thin film transistor having a top gate/bottom contact structure may also be implemented.

As described above, the n-type thin film transistor having the IZTO channel layer, which is an n-type semiconductor, together with a p-type thin film transistor may constitute an inverter as an example of a complementary TFT circuit. In this case, the p-type thin film transistor may include a p-type oxide semiconductor as a channel layer, and the p-type oxide semiconductor may be SnO, Cu$_2$O, or NiO, but is not limited thereto.

In addition, the n-type thin film transistor may be used as a switching element electrically connected to a pixel electrode of an organic light emitting diode (OLED) or liquid crystal display, or may be used as a switching element electrically connected to one electrode of a memory device, for example, a resistance change memory (RRAM), a phase change RAM (PRAM), or a magnetic RAM (MRAM). However, the present invention is not limited thereto.

Hereinafter, a preferred experimental example is presented to help understanding of the present invention. However, the following experimental examples are only to aid the understanding of the present invention, and the present invention is not limited by the following experimental examples.

TFT Preparation Examples 1-4

A 100 nm SiO$_2$ layer as a gate insulating film was grown on the p-type Si wafer by thermal oxidation of a p-type Si wafer (<0.005 Ω·cm) as a gate electrode. A shadow mask was placed on the SiO$_2$ layer, and an amorphous IZTO semiconductor pattern having a thickness of 17 nm was deposited using RF magnetron sputtering at room temperature. The sputtering IZTO target was a compound comprising indium oxide (InO$_{1.5}$), zinc oxide (ZnO) and tin oxide (SnO$_2$) in a molar ratio of 23:55:21 (the cation atomic percentage of In:Zn:Sn is 23:55:21). The RF power and operating pressure during sputtering were fixed at 50 W and 3 mtorr, respectively, under Ar atmosphere. A shadow mask was placed on the amorphous IZTO semiconductor pattern and an ITO pattern was deposited using sputtering under Ar atmosphere, thereby forming source/drain electrodes on both ends of the IZTO semiconductor pattern. The width of the semiconductor pattern was 1000 μm, and the length of the semiconductor pattern exposed between the source/drain electrodes was 300 μm. Thereafter, post-deposition annealing (PDA) was performed in an O$_2$ atmosphere at 400° C. for 1 hour. On the semiconductor pattern exposed between the source/drain electrodes, a 10 nm Ta layer was formed by sputtering using a shadow mask. At this time, the width of the Ta layer was 2300 μm wider than the width of the semiconductor pattern, and the length of the Ta layer was 150 μm shorter than the length at which the semiconductor pattern was exposed between the source/drain electrodes. A plurality of these samples was prepared and crystallization annealed for 1 hour at different temperatures in an atmospheric atmosphere, that is, an oxygen atmosphere. The crystallization annealing temperatures of these samples are summarized in Table 1 below.

TFT Preparation Examples 5-8

The same method as in TFT Preparation Example 1 was performed to prepare TFTs, except that a compound composed of indium oxide (InO$_{1.5}$), zinc oxide (ZnO) and tin oxide (SnO$_2$) in a molar ratio of 18:60:21 (cation atomic percentage of In:Zn:Sn is 18:60:21) was used as a sputtering IZTO target instead of the sputtering IZTO target used in TFT Preparation Example 1, and the TFTs were prepared by varying the crystallization annealing temperature as summarized in Table 1 below.

TFT Comparative Examples 1-3

The same method as in TFT Preparation Example 1 was performed to prepare TFTs, except that crystallization annealing was performed without forming a Ta layer on the semiconductor pattern exposed between the source/drain electrodes, and the TFTs were prepared by varying the crystallization annealing temperature as summarized in Table 1 below.

TFT Comparative Examples 4-6

The same method as in TFT Preparation Example 5 was performed to prepare TFTs, except that crystallization annealing was performed without forming a Ta layer on the semiconductor pattern exposed between the source/drain electrodes, and the TFTs were prepared by varying the crystallization annealing temperature as summarized in Table 1 below.

TABLE 1

| | Sputtering target composition Atomic Percentage of In:Zn:Sn | Crystallization annealing conditions | Crystallization annealing temperature |
|---|---|---|---|
| TFT Preparation Example 1 | 23:55:21 | Ta layer, O₂ atmosphere | 200° C. |
| TFT Preparation Example 2 | | Ta layer, O₂ atmosphere | 250 ° C. |
| TFT Preparation Example 3 | | Ta layer, O₂ atmosphere | 300 ° C. |
| TFT Preparation Example 4 | | Ta layer, O₂ atmosphere | 400 ° C. |
| TFT Comparative Example 1 | | atmospheric atmosphere | 400° C. |
| TFT Comparative Example 2 | | atmospheric atmosphere | 700 ° C. |
| TFT Comparative Example 3 | | atmospheric atmosphere | 800 ° C. |
| TFT Preparation Example 5 | 18:60:21 | Ta layer, O₂ atmosphere | 200° C. |
| TFT Preparation Example 6 | | Ta layer, O₂ atmosphere | 250° C. |
| TFT Preparation Example 7 | | Ta layer, O₂ atmosphere | 300° C. |
| TFT Preparation Example 8 | | Ta layer, O₂ atmosphere | 400 ° C. |
| TFT Comparative Example 4 | | atmospheric atmosphere | 400 ° C. |
| TFT Comparative Example 5 | | atmospheric atmosphere | 700° C. |
| TFT Comparative Example 6 | | atmospheric atmosphere | 800° C. |

FIG. 4 is a graph showing XRD patterns of IZTO semiconductor patterns included in TFTs prepared in TFT Preparation Examples 1 to 4 and TFT Comparative Examples 1 to 3.

Referring to FIG. 4, it can be seen that, compared to Preparation Examples 1, 2, and 4 and Comparative Examples 1 to 3, the IZTO semiconductor pattern included in the TFT according to Preparation Example 3 exhibit the diffraction peak corresponding to the (0021) plane when 2θ is about 32 degrees. This diffraction peak may mean that the IZTO semiconductor pattern included in the TFT according to Preparation Example 3 has a $(ZnO)_k In_2O_3$ (k=5) phase, which is a hexagonal type homologous compound phase. In addition, this diffraction peak was found to have a full width at half maximum (FWHM) of about 0.382 radians.

FIG. 5 is a graph showing XRD patterns of IZTO semiconductor patterns included in TFTs manufactured in TFT Preparation Examples 5 to 8 and TFT Comparative Examples 4 to 6.

Referring to FIG. 5, it can be seen that, compared to Preparation Examples 5, 6, and 8 and Comparative Examples 4 to 6, the diffraction peak of the IZTO semiconductor pattern included in the TFT according to Preparation Example 7 also corresponds to the (0021) plane when 2θ is about 32 degrees. This diffraction peak is similar to that of the IZTO semiconductor pattern included in the TFT according to Preparation Example 3, and the IZTO semiconductor pattern included in the TFT according to Preparation Example 7 has a $(ZnO)_k In_2O_3$ (k=5) phase, which is a hexagonal type homologous compound phase. However, this diffraction peak appeared to have a full width at half maximum (FWHM) of about 0.621 radians, indicating that the crystallinity was lower than that of the IZTO semiconductor pattern included in the TFT according to Preparation Example 3.

FIGS. 6A, 6B, 6C, and 6D are graphs showing the transmission characteristics of TFTs according to TFT Preparation Examples 1 to 4, respectively, and FIGS. 7A, 7B, 7C, and 7D are graphs showing the transmission characteristics of the TFTs according to TFT Preparation Examples 5 to 8, respectively.

Table 2 below shows the electrical characteristics of the TFTs according to TFT Preparation Examples 1 to 4 and TFT Preparation Examples 5 to 8.

TABLE 2

| | $\mu_{lin}$ (cm²V⁻¹s⁻¹) | $\mu_{sat}$ (cm²V⁻¹s⁻¹) | SS (Vdecade⁻¹) | $V_{TH}$ (V) |
|---|---|---|---|---|
| TFT Preparation Example 1 | N.A. | N.A. | N.A. | N.A. |
| TFT Preparation Example 2 | 80.49 | 50.15 | 0.14 | −0.83 |
| TFT Preparation Example 3 | 91.73 | 57.93 | 0.13 | −0.6 |
| TFT Preparation Example 4 | 46.51 | 23.93 | 0.665 | −17.573 |
| TFT Comparative Example 1 | 43.44 | 21.63 | 0.13 | −3.06 |
| TFT Preparation Example 5 | 66.48 | 35.08 | 0.27 | 0.04 |
| TFT Preparation Example 6 | 56.81 | 34.7 | 0.2 | 0.27 |
| TFT Preparation Example 7 | 46.92 | 30.2 | 0.23 | 0.2 |
| TFT Preparation Example 8 | 40.17 | 20.4 | 0.22 | −1.1 |
| TFT Comparative Example 4 | 32.37 | 15.25 | 0.17 | 0.26 |

Referring to FIGS. 6A, 6B, 6C, 6D, 7A, 7B, 7C, 7D, and Table 2 simultaneously, among the TFTs according to Preparation Examples 1 to 4, TFTs according to Preparation Examples 1 to 3 had a linear region charge mobility of 46.51 to 91.73 cm²V⁻¹s⁻¹ and a saturation region charge mobility of 23.93. to 57.93 cm²V⁻¹s⁻¹, indicating superior charge mobility compared to TFT Comparative Example 1. In addition, TFTs according to Preparation Examples 5 to 8 exhibited a linear region charge mobility of 40.17 to 66.48 cm²V⁻¹s⁻¹, indicating that they had superior charge mobility compared to TFT Comparative Example 4. Meanwhile, it can be seen that the linear region mobility of the TFT according to Preparation Example 3 is 91.73 cm²V⁻¹s⁻¹, which is significantly superior to the TFTs according to the other examples. Referring to FIGS. 6, 7, and Table 2 along with FIGS. 5 and 6, it can be seen that TFTs according to Preparation Example 3 and Preparation Example 7 each including the IZTO semiconductor pattern having a (ZnO) $_k In_2O_3$ (k=5) phase generally exhibit superior charge mobility compared to the TFTs according to Comparative Examples. The TFT according to Preparation Example 3 shows the best charge mobility, it can be estimated that excellent charge mobility appears because the diffraction peak representing the $(ZnO)_k In_2O_3$ (k=5) phase has a smaller half width and is sharper, and the atomic percentage of In:Zn:Sn shows a ratio of 23:55:21, where the ratio of Zn is 54 to 57 at %.

While the exemplary embodiments of the present invention have been described above, those of ordinary skill in the art should understood that various changes, substitutions and alterations may be made herein without departing from the spirit and scope of the present invention as defined by the following claims.

The invention claimed is:

1. A thin film transistor comprising:
a gate electrode;
a crystalline In—Zn—Sn oxide (IZTO) channel layer overlapping the upper or lower portions of the gate electrode and having hexagonal crystal grains;
a gate insulating layer disposed between the gate electrode and the IZTO channel layer; and
source and drain electrodes respectively connected to both ends of the IZTO channel layer,
wherein the hexagonal crystal grains are crystal grains having a $(ZnO)_k In_2O_3$ (k is an integer of 3 to 11) phase and the IZTO channel layer further has $(x)ZnIn_2O_4$-$(1-x)Zn_2SnO_4$ ($0<x<0.45$), as a sub-solid phase.

2. The thin film transistor of claim 1, wherein the k is 5 in the $(ZnO)_k In_2O_3$ phase.

3. The thin film transistor of claim 1, wherein $SnO_2$ is mixed in the $(ZnO)_k In_2O_3$ (k is an integer of 3 to 11) phase to exist in the form of a solid solution.

4. A thin film transistor, comprising:
a gate electrode;
a crystalline In—Zn—Sn oxide (IZTO) channel layer overlapping the upper or lower portions of the gate electrode and having hexagonal crystal grains;
a gate insulating layer disposed between the gate electrode and the IZTO channel layer; and
source and drain electrodes respectively connected to both ends of the IZTO channel layer,
wherein the XRD graph for the IZTO channel layer shows a diffraction peak corresponding to (0021) plane.

5. The thin film transistor of claim 4, wherein a full width at half maximum (FWHM) of the diffraction peak is about 0.3 to 0.5 radians.

6. The thin film transistor of claim 1, wherein the IZTO channel layer has 21 to 25 at % of indium (In), 54 to 57 at % of zinc (Zn), and 19 to 22 at % of tin (Sn) when the sum of the number of atoms of indium, zinc, and tin is 100%.

7. The thin film transistor of claim 6, wherein the IZTO channel layer has 22.5 to 23.5 at % of In, 54.7 to 55.5 at % of Zn, and 20.5 to 21.3 at % of Sn when the sum of the number of atoms of indium, zinc, and tin is 100%.

8. A preparation method for a crystalline IZTO comprising:
forming an amorphous In—Zn—Sn oxide (IZTO) layer on a substrate;
forming a transition metal layer containing a transition metal having a large oxidation tendency compared to In, Zn, and Sn under the amorphous IZTO layer before forming the amorphous IZTO layer or on the amorphous IZTO layer after forming the amorphous IZTO layer; and
changing the amorphous IZTO layer into a crystalline IZTO layer having hexagonal crystal grains by performing a crystallization heat treatment on the substrate on which the amorphous IZTO layer and the transition metal layer are formed,
wherein the hexagonal crystal grains are crystal grains having a $(ZnO)_k In_2O_3$ (k is an integer of 3 to 11) phase and the IZTO channel layer further has $(x)ZnIn_2O_4$-$(1-x)Zn_2SnO_4$ ($0<x<0.45$), as a sub-solid phase.

9. The preparation method of claim 8, wherein the amorphous IZTO layer has 21 to 25 at % of indium (In), 54 to 57 at % of zinc (Zn), and 19 to 22 at % of tin (Sn) when the sum of the number of atoms of indium, zinc, and tin is 100%.

10. The preparation method of claim 9, wherein the amorphous IZTO layer has 22.5 to 23.5 at % of In, 54.7 to 55.5 at % of Zn, and 20.5 to 21.3 at % of Sn when the sum of the number of atoms of indium, zinc, and tin is 100%.

11. The preparation method of claim 8, wherein the heat treatment temperature is 270° C. to 350° C.

12. The preparation method of claim 8, wherein the transition metal layer is a Ta layer.

13. The preparation method of claim 8, wherein the hexagonal crystal grains are crystal grains having a $(ZnO)_k In_2O_3$ (k is 5) phase.

14. A method for preparation a thin film transistor including a gate electrode on a substrate; a channel layer overlapping the upper or lower portions of the gate electrode; a gate insulating layer disposed between the gate electrode and the channel layer; and source and drain electrodes respectively connected to both ends of the channel layer, comprising:
forming an amorphous In—Zn—Sn oxide (IZTO) layer;
forming a transition metal layer containing a transition metal having a large oxidation tendency compared to In, Zn, and Sn under the amorphous IZTO layer before forming the amorphous IZTO layer or on the amorphous IZTO layer after forming the amorphous IZTO layer; and
changing the amorphous IZTO layer into a crystalline IZTO layer having hexagonal crystal grains by performing a crystallization heat treatment on the substrate on which the amorphous IZTO layer and the transition metal layer are formed,
wherein the crystalline IZTO layer is the channel layer, and
wherein the hexagonal crystal grains are crystal grains having a $(ZnO)_k In_2O_3$ (k is an integer of 3 to 11) phase and the IZTO channel layer further has $(x)ZnIn_2O_4$-$(1-x)Zn_2SnO_4$ ($0<x<0.45$), as a sub-solid phase.

15. The preparation method of claim 14, wherein the amorphous IZTO layer has 21 to 25 at % of indium (In), 54 to 57 at % of zinc (Zn), and 19 to 22 at % of tin (Sn) when the sum of the number of atoms of indium, zinc, and tin is 100%.

16. The preparation method of claim 14, wherein the transition metal layer is a Ta layer.

17. The preparation method of claim 14, wherein the hexagonal crystal grains are crystal grains having a $(ZnO)_k In_2O_3$ (k is 5) phase.

* * * * *